US012730135B2

(12) United States Patent
Theuss

(10) Patent No.: US 12,730,135 B2
(45) Date of Patent: Sep. 8, 2026

(54) CHIP PACKAGE WITH CONTACT CLIP

(71) Applicant: Infineon Technologies AG, Neubiberg (DE)

(72) Inventor: Horst Theuss, Wenzenbach (DE)

(73) Assignee: Infineon Technologies AG, Neubiberg (DE)

( * ) Notice: Subject to any disclaimer, the term of this patent is extended or adjusted under 35 U.S.C. 154(b) by 844 days.

(21) Appl. No.: 17/954,711

(22) Filed: Sep. 28, 2022

(65) Prior Publication Data

US 2023/0094566 A1 Mar. 30, 2023

(30) Foreign Application Priority Data

Sep. 30, 2021 (DE) ........................ 102021125397.7

(51) Int. Cl.

| | |
|---|---|
| ***G01R 15/20*** | (2006.01) |
| ***H10W 40/22*** | (2026.01) |
| ***H10W 72/00*** | (2026.01) |
| ***H10W 72/60*** | (2026.01) |
| ***H10W 74/00*** | (2026.01) |
| ***H10W 74/10*** | (2026.01) |
| ***H10W 74/40*** | (2026.01) |
| ***H10W 74/47*** | (2026.01) |
| ***H10W 90/00*** | (2026.01) |

(52) U.S. Cl.

CPC ......... *G01R 15/207* (2013.01); *G01R 15/202* (2013.01); *H10W 40/22* (2026.01); *H10W 40/228* (2026.01); *H10W 72/631* (2026.01); *H10W 74/121* (2026.01); *H10W 74/141* (2026.01); *H10W 74/476* (2026.01); *H10W 90/00* (2026.01); *H10W 72/07653* (2026.01); *H10W 72/871* (2026.01); *H10W 74/00* (2026.01); *H10W 74/10* (2026.01); *H10W 74/40* (2026.01); *H10W 90/755* (2026.01); *H10W 90/763* (2026.01)

(58) Field of Classification Search

CPC .............................. H01L 24/40; G01R 15/202

See application file for complete search history.

(56) References Cited

U.S. PATENT DOCUMENTS 4,707,726 A * 11/1987 Tinder ................ H10W 40/611 257/796

6,255,722 B1 * 7/2001 Ewer .................. H10W 40/641 257/730

(Continued)

FOREIGN PATENT DOCUMENTS

DE 3612862 A1 11/1986

DE 19926128 A1 12/1999

(Continued)

*Primary Examiner* — Dale E Page

*Assistant Examiner* — Rohit Parthasarathy

(74) *Attorney, Agent, or Firm* — Murphy, Bilak & Homiller, PLLC

(57) ABSTRACT

According to an exemplary embodiment, a semiconductor component includes a chip carrier, a semiconductor chip mounted on the chip carrier, and a chip package made of potting compound. The potting compound only partially surrounds the semiconductor chip, such that at least part of an upper side of the semiconductor chip is not covered by the potting compound. The semiconductor component further includes a clip that is mechanically connected to the upper side of the semiconductor chip.

14 Claims, 5 Drawing Sheets

(56) References Cited

U.S. PATENT DOCUMENTS

| | | | | |
|---|---|---|---|---|
| 9,230,880 | B2 * | 1/2016 | Otremba | H10W 40/611 |
| 9,547,024 | B2 * | 1/2017 | Racz | G01R 15/20 |
| 11,835,600 | B2 * | 12/2023 | Schaller | G01R 33/072 |
| 2005/0224248 | A1 * | 10/2005 | Gagnon | G01R 15/207 174/536 |
| 2007/0040260 | A1 * | 2/2007 | Otremba | H10W 74/111 257/E23.052 |
| 2008/0054449 | A1 * | 3/2008 | Hirler | H10W 40/778 257/713 |
| 2008/0073773 | A1 * | 3/2008 | Huber | H10W 70/042 257/690 |
| 2009/0001562 | A1 * | 1/2009 | Otremba | H10W 72/60 257/723 |
| 2009/0026560 | A1 * | 1/2009 | Wombacher | H10W 74/43 257/E31.117 |
| 2010/0078784 | A1 * | 4/2010 | Otremba | H10W 70/481 257/676 |
| 2010/0230766 | A1 * | 9/2010 | Elian | G01L 19/141 257/E29.166 |
| 2010/0295140 | A1 * | 11/2010 | Theuss | B82Y 25/00 257/E21.532 |
| 2013/0161801 | A1 * | 6/2013 | Otremba | H10W 72/00 361/813 |
| 2014/0110828 | A1 * | 4/2014 | Otremba | H10W 70/481 438/122 |
| 2014/0333301 | A1 * | 11/2014 | Racz | G01R 15/20 324/251 |
| 2015/0214133 | A1 * | 7/2015 | Otremba | H10W 40/611 438/122 |
| 2015/0340307 | A1 * | 11/2015 | Gabler | H10P 54/00 257/676 |
| 2017/0011982 | A1 * | 1/2017 | Theuss | H10W 90/00 |
| 2019/0293923 | A1 * | 9/2019 | Ghahremani | B81B 7/0067 |
| 2020/0365549 | A1 * | 11/2020 | Levardo | H10W 72/00 |

FOREIGN PATENT DOCUMENTS

| | | | | |
|---|---|---|---|---|
| DE | 102015100862 | A1 | 7/2015 | |
| WO | WO-2012113645 | A1 * | 8/2012 | H10H 20/8506 |

* cited by examiner magnetic field sensor 40 chip metallization 21 clip 13

$i_M$ $i_M$ chip 20 connection pins 12 bonding wire 11 projection 35 (for orientation)

potting compound 30

CHIP PACKAGE WITH CONTACT CLIP

TECHNICAL FIELD

The present invention relates to the field of chip packages for semiconductor chips, and in particular to a concept for a chip package with contacts for high and for low currents.

BACKGROUND

Typical applications where chip packages have contacts (connection pins) for both high currents and low currents are current sensors. The load current to be measured can be several amperes, whereas the sensor signals cause only low currents (for example in the region of less than 1 mA).

Existing packaging concepts envisage the use of clips as contact elements for high currents, which are connected to the semiconductor chip by means of clip bonding. Clip bonding takes place before the chip is encapsulated. Such packaging processes are more complex than the known packaging processes for "normal" chips, which do not require high-current chip contacts. The inventors have set themselves the task of improving existing packaging concepts for applications in which high-current chip contacts are required.

SUMMARY

The above-stated task is achieved by the component as claimed in claims 1 and 14. Various exemplary embodiments and developments are the subject of the dependent claims.

According to an exemplary embodiment, the semiconductor component comprises a chip carrier, a semiconductor chip mounted on the chip carrier, and a chip package made of potting compound. The potting compound only partially surrounds the semiconductor chip, such that at least part of an upper side of the semiconductor chip is not covered by the potting compound. The semiconductor component further comprises a clip that is at least mechanically connected to the upper side of the semiconductor chip.

According to another exemplary embodiment, the component comprises a chip carrier, a semiconductor chip mounted on the chip carrier with a sensor element integrated therein, and a chip package made of potting compound surrounding the semiconductor chip, wherein the surface of the potting compound has a step such that the thickness of the potting compound over the semiconductor chip is reduced at least over the sensor element. The component further comprises a clip which contacts the surface of the potting compound over the sensor element. The chip carrier and the clip each have one or more connection contacts for mounting on a printed circuit board.

BRIEF DESCRIPTION OF THE FIGURES

Various implementations are explained in greater detail hereinafter with reference to examples shown in the figures. The illustrations are not necessarily to scale and the invention is not limited to the aspects illustrated. Rather, emphasis is placed on illustrating the underlying principles of the illustrated exemplary embodiments.

DETAILED DESCRIPTION

Figure 1A:
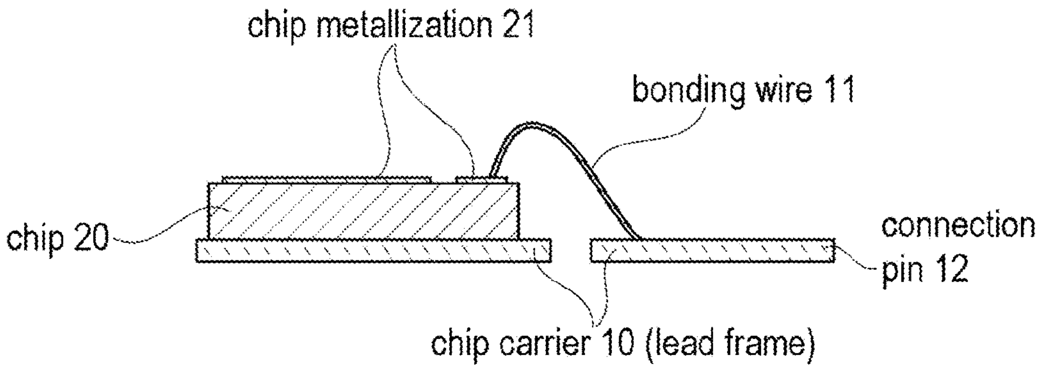
FIGS. 1*a* to 1*c* illustrate an example of a method for producing a semiconductor component with a clip as high-current chip contact.
Figure 1B:
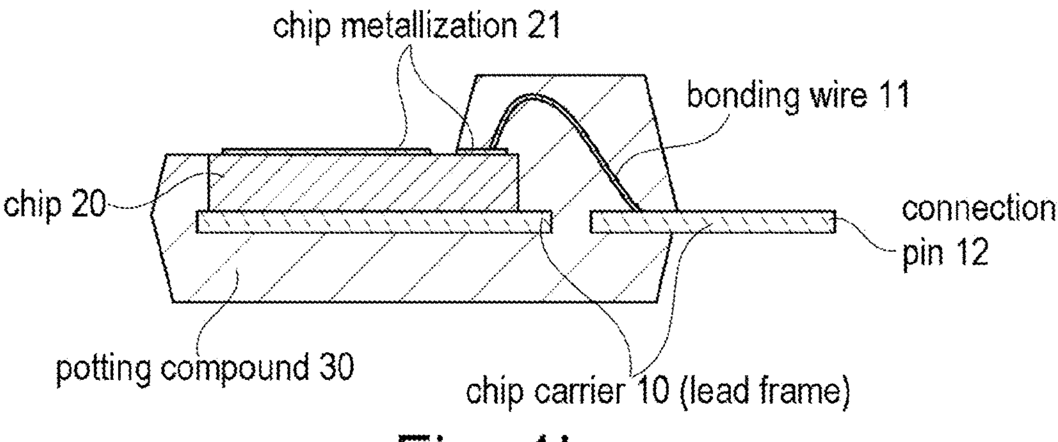
Figure 1C:
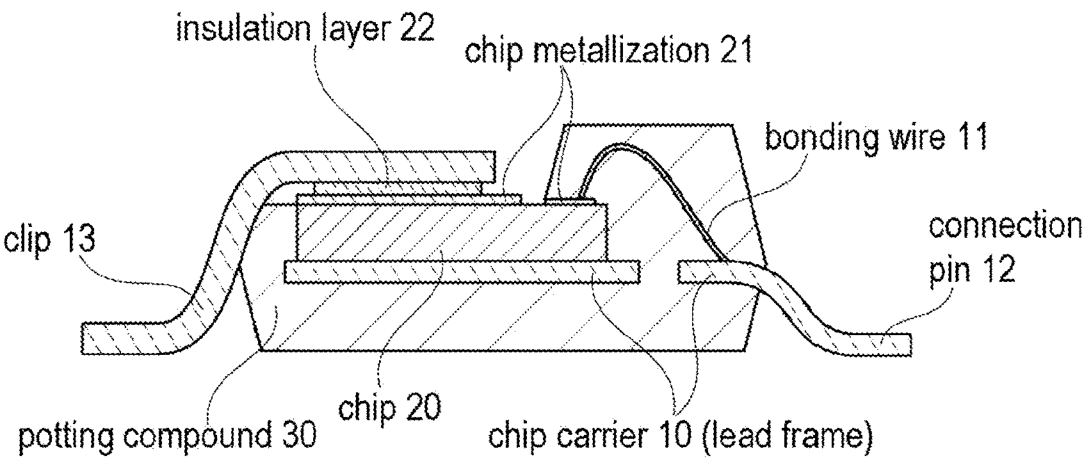

FIGS. 1*a* to 1*c* illustrate an example of a method for producing a semiconductor component, with respective diagrams showing the (intermediate) result of various method steps. In a first step, a semiconductor chip 20 (semiconductor die) is mounted on a chip carrier 10, for example using an adhesive or by means of soldering. The chip carrier can be, for example, a so-called lead frame and can have a plurality of connection pins 12 (chip contacts). The underside of the semiconductor chip 20 is bonded to the chip carrier 10 and the upper side of the semiconductor chip has a structured chip metallization 21. The chip metallization can, for example, comprise bond pads which are connected to corresponding connection pins 12 of the chip carrier 10 by means of bond wires 11. The result of this chip mounting process (die attach process) is shown in FIG. 1*a*.

After mounting the semiconductor chip 20 on the chip carrier 10, the semiconductor chip is encapsulated in potting compound. The encapsulation forms the chip package 30. The intermediate result after production of the encapsulation is shown in FIG. 1*b*. As can be seen in FIG. 1*b*, a part of the semiconductor chip 20 is not covered by the potting compound. Such an encapsulation can be produced using a modified transfer molding process called film assisted molding (FAM).

FAM is a variant of the known transfer molding process. In this case, a film is inserted into the mold before the semiconductor chip mounted on the chip carrier is inserted into the mold. This is followed by the usual encapsulation process used in transfer molding. The potting compound is first liquefied by heat and pressure, then pressed into the cavities of the mold and held there under heat and pressure until the potting compound has solidified. After the mold is opened, the encapsulated products are removed. Those parts of the semiconductor chip that are not to be covered by potting compound are defined by the film. In this way, chip packages with openings can be easily produced.

After the FAM process, a clip 13 is attached to the surface (not covered by potting compound) of the semiconductor chip. The clip is connected to the upper side of the semiconductor chip 20, at least mechanically. In the example shown in FIG. 1*c*, an insulation layer 22 ensures that the clip 13 and the semiconductor chip 20 are electrically insulated from each other. In other examples, an electrical connection between the clip 13 may be desired. In this case, there is no insulation layer, but instead the clip 13 is electrically conductively connected to a part (for example a contact pad) of the chip metallization. In this case, the clip 13 can be connected to the chip metallization by means of soldering. In other examples, an adhesive can be used. At this juncture, emphasis is on the fact that the clip is mounted only after the chip package has been produced.

Figures 2A, 2B:
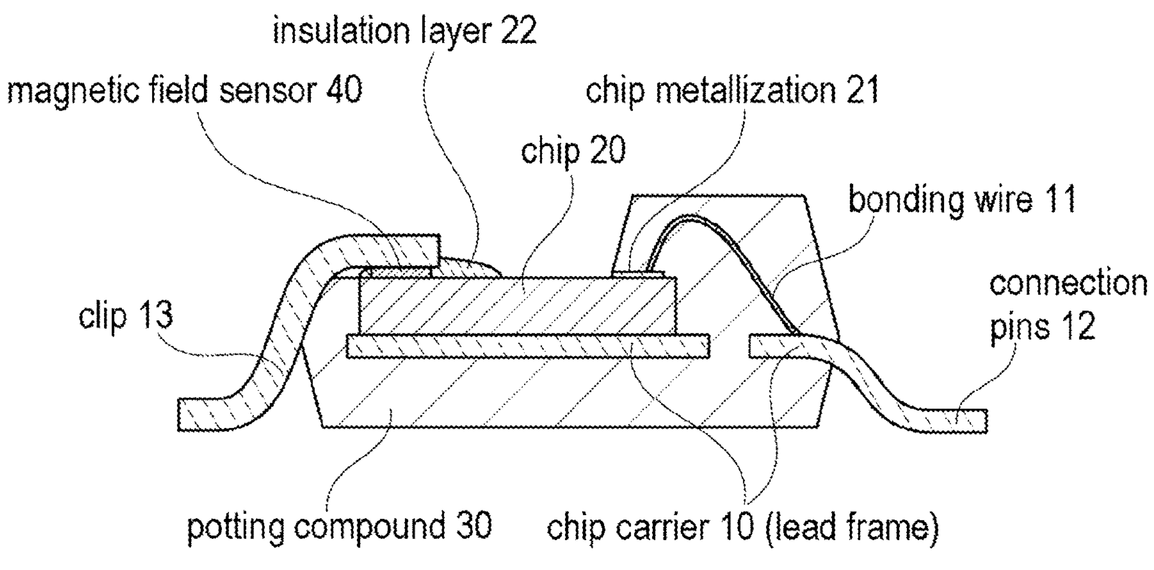
FIGS. 2*a* to 2*b* illustrate a side view and a plan view, respectively, of a semiconductor component according to the examples described herein.

FIGS. 2*a* and 2*b* illustrate an example of an application of a semiconductor component according to FIGS. 1*a* to 1*c*. FIG. 2*a* shows a side view and FIG. 2*b* shows the corresponding plan view. The example in FIG. 2*a* is substantially the same as the semiconductor component from FIG. 1*c*, and reference is made to the description provided in that regard further above. However, FIGS. 2*a* and 2*b* explicitly show a magnetic field sensor 40 (an element sensitive to magnetic fields) integrated in the semiconductor chip 20 and arranged below a central part of the clip 13, the insulation layer 22 electrically insulating the clip 13 from the semiconductor chip 20 and in particular from the magnetic field sensor 40.

The magnetic field sensor 40 may be part of a current sensor. In FIG. 2*b*, the shape of the clip 13 and the current flow through the clip 13 can be seen (current to be measured $i_M$). The clip 13 is fundamentally a piece of bent sheet metal having a taper with a central part, under which the magnetic field sensor 40 is located. The magnetic field sensor 40 can be, for example, a Hall element. Alternatively, the magnetic field sensor can comprise one or more magnetoresistive elements. Other types of sensor elements can also be used. The magnetic field sensor 40 is configured to generate a sensor signal that depends on the magnetic field generated by the current $i_M$ to be measured. The level of the sensor signal can be approximately proportional to the current $i_M$, the proportionality factor depending on the design of the sensor and the geometry of the clip 13. The operation of indirect current measurement by means of magnetic field sensors is known in itself and will therefore not be discussed further here. The four connection pins 12 can be used, for example, to feed a supply voltage and to output the (possibly pre-processed) sensor signal.

In the example of FIG. 2*b*, it can be seen that the clip 13 and the package made of potting compound can have corresponding geometries (contours) that define the relative position of the clip 13 with respect to the chip package when the clip is in contact with the chip package. These corresponding geometries serve for orientation (alignment) of the clip 13 on the chip package. In the case illustrated in FIGS. 2*a* and 2*b*, the chip package has one or more projections 35 and the clip 13 has one or more corresponding holes or indentations into which the projections 35 are inserted. However, the mentioned projections and holes are only an example of corresponding geometries. It is understood that the clip can also have projections and the chip package can have corresponding indentations. Corresponding geometries/contours such as projections and indentations can be used not only to orient the clip on the package, but also to produce a plug-in or snap-fit connection that can be used to hold the clip on the package.

Figure 3:
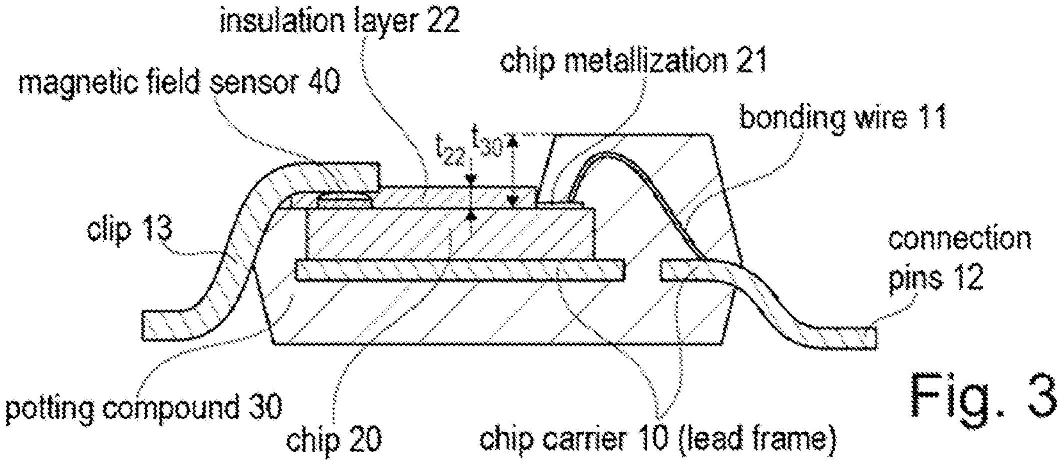
FIGS. 3-5 show different modified variants of the example from FIGS. 2*a* to 2*b*.
Figure 4:
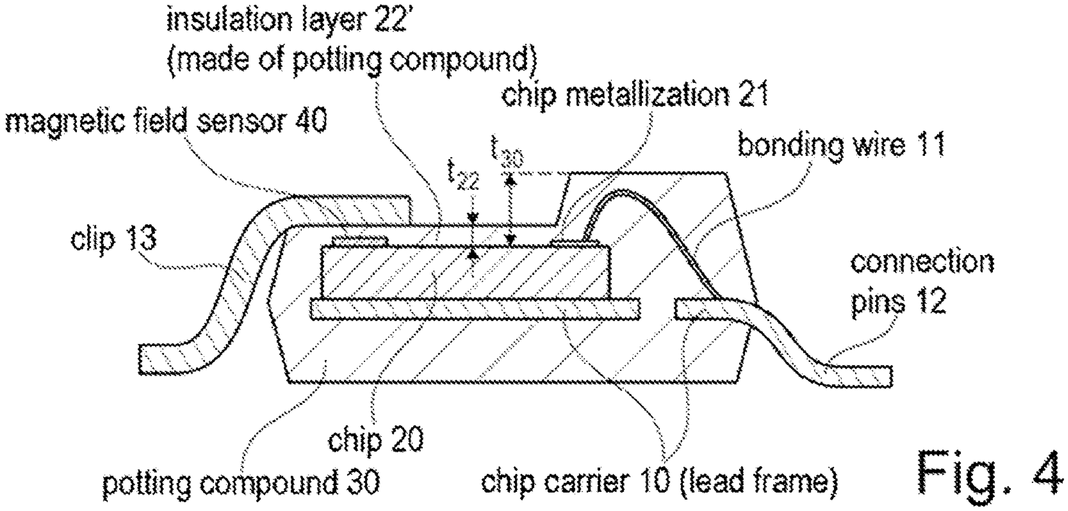
Figure 5:
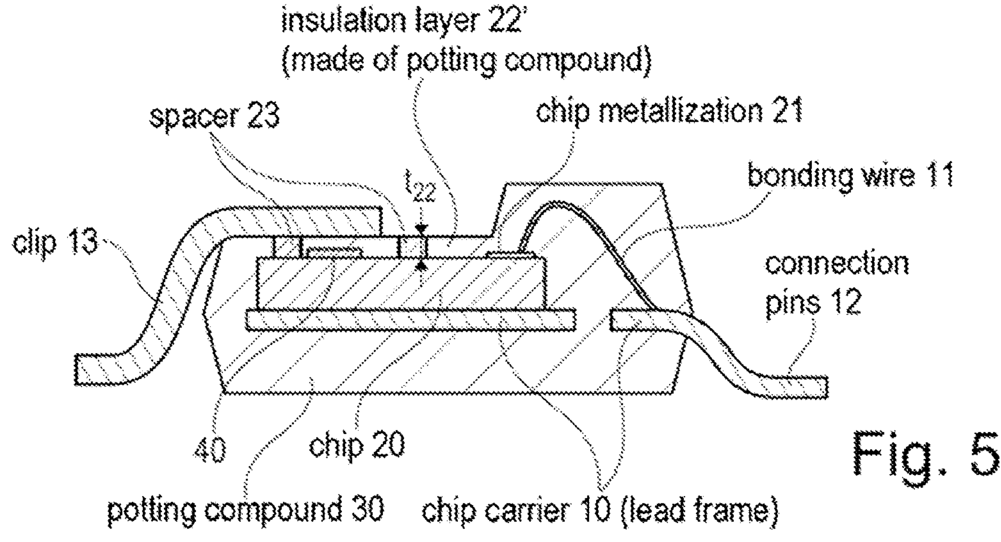

FIGS. 3-5 show various modifications of the example from FIGS. 2*a* and 2*b*, with only the differences from the example from FIGS. 2*a* and 2*b* being discussed below. The example from FIG. 3 is substantially the same as in the previous example from FIG. 2*a*. The only difference is that the insulation layer 22 not only insulates the clip 13 with respect to the semiconductor chip 20 but covers the entire free (i.e. not covered by potting compound) surface of the semiconductor chip 20. The insulation layer 22 can be applied before or after the FAM process. Furthermore, the thickness $t_{22}$ of the insulation layer 22 is significantly less than the thickness $t_{30}$ (above the chip surface) of the potting compound in a 'normal' chip package. The thickness $t_{22}$ has an effect on the geometry of the current sensor arrangement because it determines the relative position of the clip with respect to the magnetic field sensor element 40. In the present example, the insulation layer 22 can consist of a polyimide.

The example of FIG. 4 is very similar to the example of FIG. 3, although in FIG. 4, instead of the insulation layer 22, a thin layer 22' of potting compound serves as insulation layer. That is to say, the surface of the potting compound 30 has a step, so that the thickness $t_{22}$ of the potting compound over the upper side of the semiconductor chip 20 is reduced at least in the region of the sensor element 40 (compared to the thickness $t_{30}$ in the region of an edge of the semiconductor chip 20). In the illustrated example, the step height is $t_{30}$-$t_{22}$. Such a structure can be easily produced by means of a FAM process.

The example from FIG. 5 is very similar to the example from FIG. 4. The difference between the two examples is fundamentally that, according to FIG. 5, spacers 23 are arranged on the semiconductor chip 20 and have the thickness $t_{22}$. These spacers 23 are applied to the semiconductor chip 20 before the molding process and thus define the thickness of the insulation layer 22' of potting compound over the chip. The FAM process can be controlled more precisely with the help of the spacers 23 so that the thickness of the insulation layer 22' corresponds exactly to the desired value.

Figure 6:
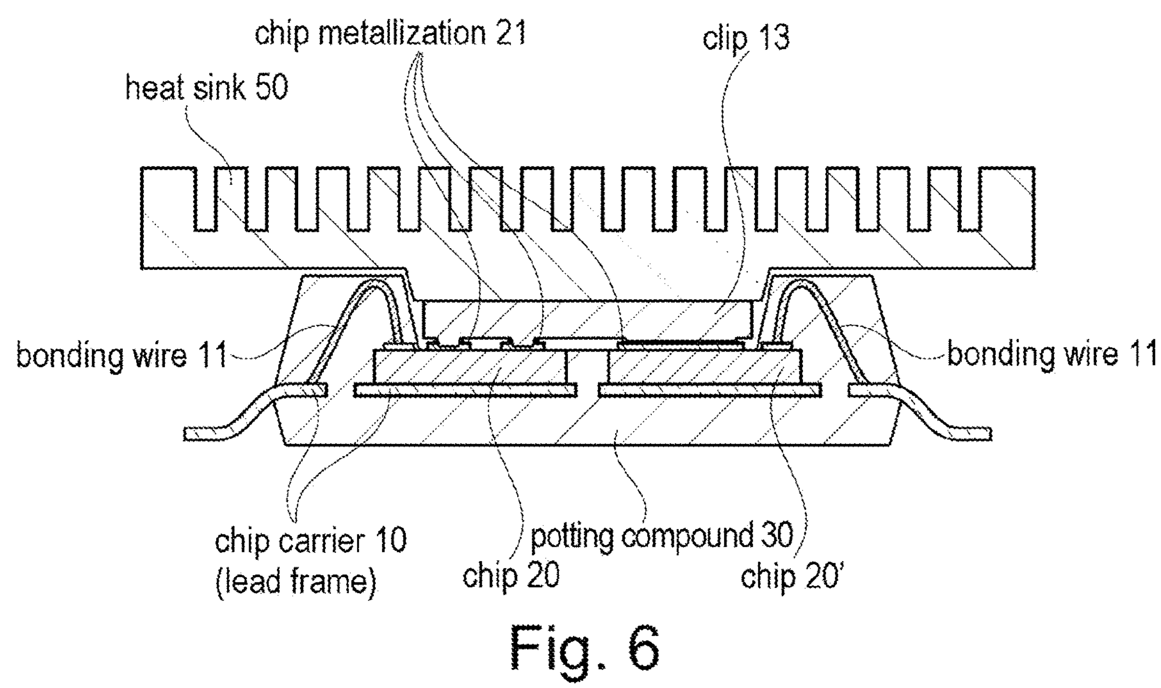
FIGS. 6 and 7 show two further examples that allow cooling by means of heat sinks.
Figure 7:
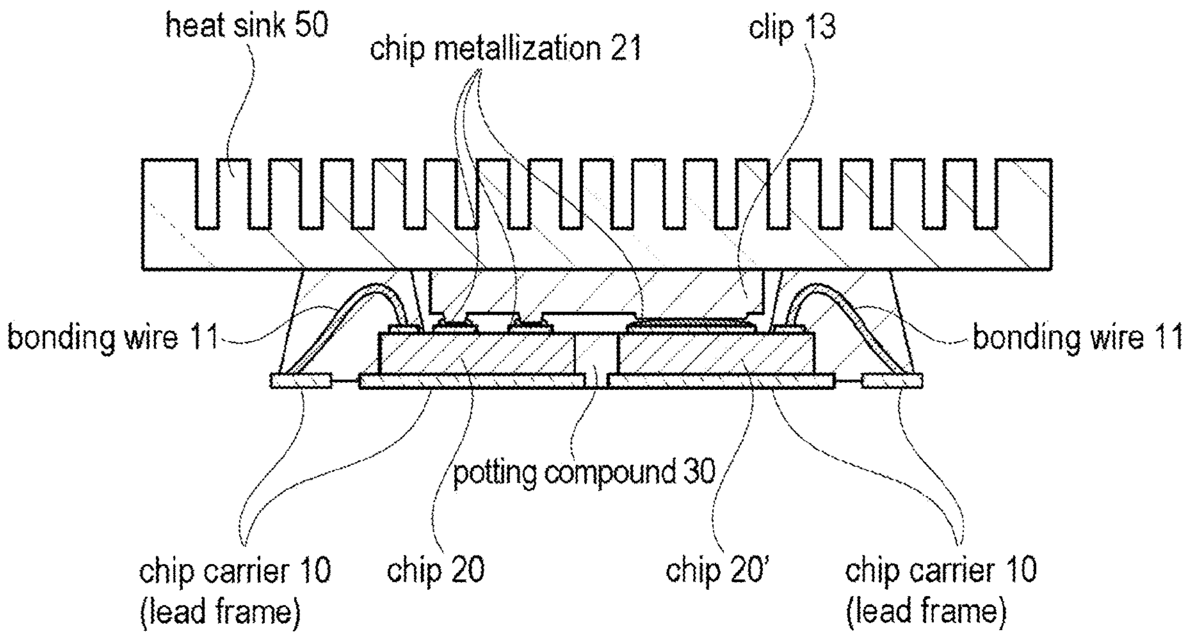

FIGS. 6 and 7 illustrate other examples in which the clip 13 is electrically connected to the upper side of the semiconductor chip 20 (i.e., to the chip metallization 21). In the example from FIG. 6, two semiconductor chips 20 and 20' are mounted on the chip carrier 10 (die bonding of the chip 20 and wire bonding of the bonding wires 11). The chip package is produced using a FAM process, as in the previous examples, with the upper sides (and thus the chip metallizations 21 and 21') remaining at least partially exposed and not covered by the potting compound 30.

After the chip package (potting compound 30) has been produced, the clip 13 is attached to the semiconductor chips 20 and 20' (for example by soldering or bonding). In some applications, a heat sink 50 can be arranged on the clip 13 to remove heat from the semiconductor chips 20 and 20' (indirectly via the clip 13). Cooling may be necessary or useful in power electronics applications, for example. In some examples, the chips 20 and 20' each include a semiconductor switch, which can be connected to form a transistor half-bridge.

The example from FIG. 7 differs from the example from FIG. 6 fundamentally by the shape of the chip package. According to the FIG. 7, the lead frame 10 and the potting compound form a so-called leadless package, which can also be cooled on the other side.

Figure 8:
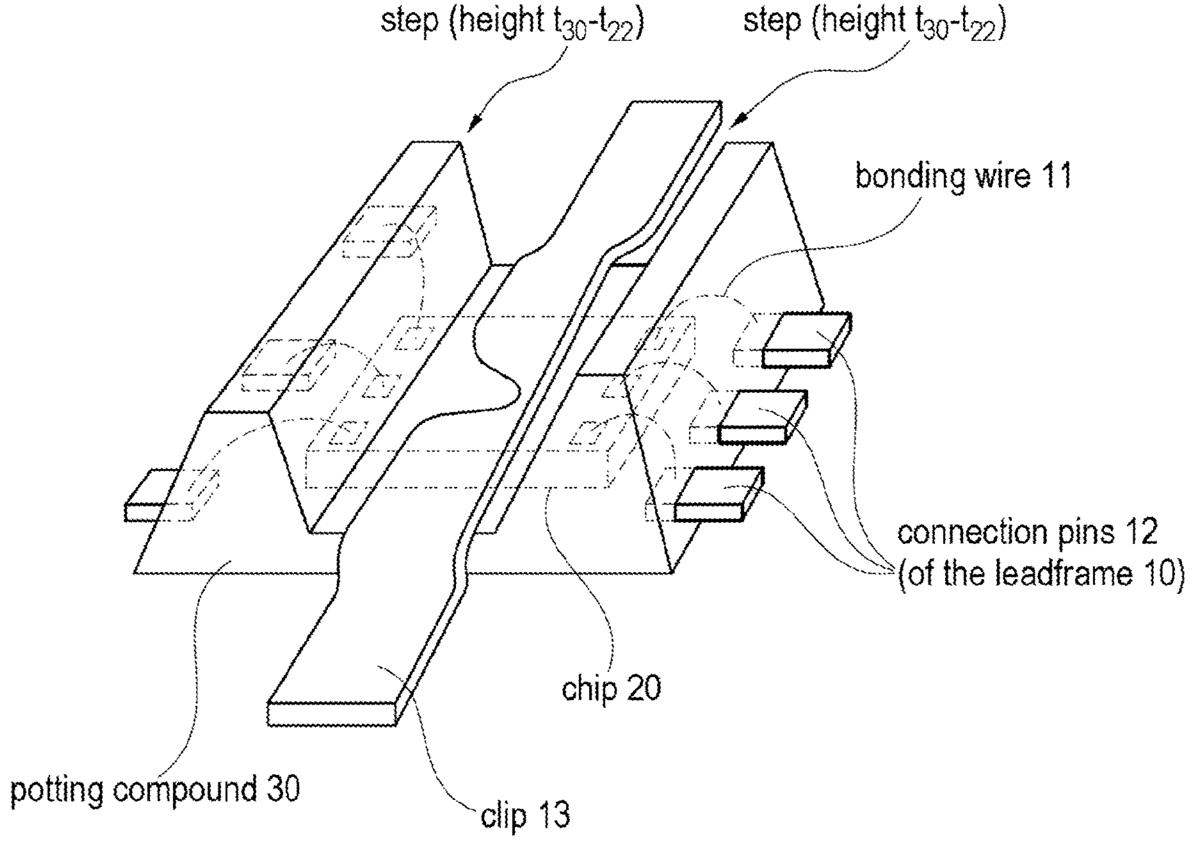
FIG. 8 shows a modification of the example from FIGS. 2*a* to 2*b*.

FIG. 8 shows a modification of the example from FIGS. 2*a* and 2*b*. Unlike in FIGS. 2*a* and 2*b*, the clip 13 does not run over a single edge of the chip package, but over two opposite edges of the chip package. That is to say, the clip 13 runs once across the chip package, which in this example has a kind of groove formed by two opposing (and, for example, equally high) steps in the chip package. The bottom of the groove is formed by the semiconductor chip 20, which is not covered by the potting compound 30. The clip can nevertheless be insulated from the semiconductor chip 20, as is the case, for example, in the examples from FIGS. 3-5. A magnetic field sensor element 40 can be arranged under the central part of the clip 13 (which has a taper) as in FIGS. 2*a* and 2*b* (not shown in FIG. 8).

It is understood that various aspects of the examples shown can be combined to provide further examples. For example, the heat sink can also be used in the examples of FIGS. 3-5. Leadless packages can also be used in the examples of FIGS. 1*a*-5. The insulation layers 22 or 22' (see FIGS. 3-5) can be omitted depending on the application.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor component, comprising:
a chip carrier;
a semiconductor chip mounted on the chip carrier;
a chip package made of potting compound that only partially surrounds the semiconductor chip, such that at least part of an upper side of the semiconductor chip is not covered by the potting compound; and
a clip mechanically connected to the upper side of the semiconductor chip,
wherein the clip and the chip package are mechanically connected via a plug-in or snap-fit connection.

2. The semiconductor component of claim 1, wherein the chip carrier and the clip each have one or more connection contacts for mounting on a printed circuit board.

3. The semiconductor component of claim 2, further comprising:
bonding wires electrically connecting the one or more connection contacts of the chip carrier to the semiconductor chip,
wherein the bonding wires are covered by the potting compound.

4. The semiconductor component of claim 2, wherein the one or more connection contacts of the chip carrier are pins for push-through or surface mounting or solder balls for surface mounting.

5. The semiconductor component of claim 1, further comprising:
an electrically conductive connection between the clip and a chip metallization on the upper side of the semiconductor chip.

6. The semiconductor component of claim 1, wherein the clip is electrically insulated from a chip metallization on the upper side of the semiconductor chip.

7. The semiconductor component of claim 6, further comprising:
a dielectric layer arranged between the clip and the chip metallization.

8. The semiconductor component of claim 1, further comprising:
an element sensitive to magnetic fields integrated in the semiconductor chip below the clip.

9. The semiconductor component of claim 1, wherein the chip package has one or more projections and the clip has one or more corresponding holes or indentations into which the one or more projections are inserted.

10. The semiconductor component of claim 1, wherein the clip and the chip package have corresponding geometries that define a relative position of the clip with respect to the chip package when the clip rests against the chip package.

11. The semiconductor component of claim 1, further comprising:
a further semiconductor chip mounted on the chip carrier,
wherein the clip is connected to a chip metallization of the semiconductor chip and a chip metallization of the further semiconductor chip.

12. The semiconductor component of claim 1, further comprising:
a cooling device connected to the clip.

13. A semiconductor component, comprising:
a chip carrier;
a semiconductor chip mounted on the chip carrier;
a chip package made of potting compound that only partially surrounds the semiconductor chip, such that at least part of an upper side of the semiconductor chip is not covered by the potting compound; and
a clip mechanically connected to the upper side of the semiconductor chip,
wherein the clip and the chip package have corresponding geometries that define a relative position of the clip with respect to the chip package when the clip rests against the chip package.

14. A semiconductor component, comprising:
a chip carrier;
a semiconductor chip mounted on the chip carrier;
a chip package made of potting compound that only partially surrounds the semiconductor chip, such that at least part of an upper side of the semiconductor chip is not covered by the potting compound;
a clip mechanically connected to the upper side of the semiconductor chip; and
a further semiconductor chip mounted on the chip carrier,
wherein the clip is connected to a chip metallization of the semiconductor chip and a chip metallization of the further semiconductor chip.

* * * * *